(12) United States Patent
Lee

(10) Patent No.: US 7,838,405 B2
(45) Date of Patent: Nov. 23, 2010

(54) METHOD FOR MANUFACTURING SEMICONDUCTOR DEVICE HAVING BULB-TYPE RECESSED CHANNEL

(75) Inventor: Jin Yul Lee, Icheon (KR)

(73) Assignee: Hynix Semiconductor Inc., Icheon-si (KR)

( * ) Notice: Subject to any disclaimer, the term of this patent is extended or adjusted under 35 U.S.C. 154(b) by 240 days.

(21) Appl. No.: 11/760,818

(22) Filed: Jun. 11, 2007

(65) Prior Publication Data
US 2008/0160700 A1 Jul. 3, 2008

(30) Foreign Application Priority Data
Dec. 29, 2006 (KR) ................ 10-2006-0138808

(51) Int. Cl.
*H01L 21/336* (2006.01)
(52) U.S. Cl. .............. 438/589; 257/E21.429; 438/270
(58) Field of Classification Search ......... 257/330–333, 257/E21.429, E21.431, E21.433, E21.442, 257/E21.428; 438/270–272, 589
See application file for complete search history.

(56) References Cited

U.S. PATENT DOCUMENTS

| | | | |
|---|---|---|---|
| 6,087,222 A * | 7/2000 | Jung Lin et al. ............. | 438/259 |
| 7,220,640 B2 * | 5/2007 | Kim ............................ | 438/243 |
| 2003/0022482 A1 * | 1/2003 | Nagashima .................. | 438/633 |
| 2005/0199930 A1 * | 9/2005 | Seo et al. ..................... | 257/296 |
| 2005/0277287 A1 * | 12/2005 | Chen et al. ................... | 438/637 |
| 2006/0113590 A1 * | 6/2006 | Kim et al. .................... | 257/330 |
| 2006/0273381 A1 * | 12/2006 | Kim et al. .................... | 257/330 |
| 2006/0284272 A1 * | 12/2006 | Hsu ............................. | 257/412 |
| 2007/0096204 A1 * | 5/2007 | Shiratake .................... | 257/330 |
| 2007/0105388 A1 | 5/2007 | Lee et al. | |
| 2007/0111469 A1 | 5/2007 | Kim et al. | |
| 2008/0121961 A1 * | 5/2008 | Schloesser ................. | 257/302 |

FOREIGN PATENT DOCUMENTS

KR 10-2006-0039366 5/2006

* cited by examiner

*Primary Examiner*—Matthew W Such
*Assistant Examiner*—Ali Naraghi
(74) *Attorney, Agent, or Firm*—Marshall, Gerstein & Borun LLP

(57) ABSTRACT

A method for manufacturing a semiconductor device having a bulb-type recessed channel including: forming a trench that defines an active region including a channel region having a sidewall and a junction region in a semiconductor substrate; forming a device isolation layer that buries the trench, and forming a sidewall pattern that covers the sidewall of the channel region; forming a bulb-type trench by overlapping with the channel region in the semiconductor substrate, and forming a bottom protrusion having a predetermined space parted from the device isolation layer by removing the sidewall pattern; and forming a gate stack that overlaps with the bulb-type trench and the bottom protrusion.

8 Claims, 11 Drawing Sheets

METHOD FOR MANUFACTURING SEMICONDUCTOR DEVICE HAVING BULB-TYPE RECESSED CHANNEL

CROSS-REFERENCE TO RELATED APPLICATION

The priority of Korean patent application number 10-2006-138808, filed on Dec. 29, 2006, which is incorporated by reference in its entirety, is claimed.

BACKGROUND OF THE INVENTION

The invention relates to a semiconductor device and, more particularly, to a method for manufacturing a semiconductor device having bulb-type recessed channels.

With a drastic decrease in the design rules for integrated circuit semiconductor devices, there has been difficulty in ensuring stable operation of transistors. Especially, with a decrease in the design rules for semiconductor devices to a level of 70 nm or less, the size of transistors also has decreased so that the margin of the cell threshold voltage and refresh property reached its limitation.

Under such circumstances, a great deal of research has been conducted on methods for ensuring a longer effective channel length without any increase in the design rules. Among the methods for ensuring a longer effective channel length, an attempt to extend the channel length using a FinFET that introduced a transistor having recessed channels and Fin-shape active regions as structures to extend channel length with respect to a limited gate linewidth has been realized.

However, commercialized high speed double data rate (DDR) 2 DRAM products define test conditions at a high temperature such that the data retention time decreases rapidly compared with the conventional DDR DRAM product. Moreover, deterioration in the transistor drive current characteristics due to the reduced size of active regions in the width direction was also induced. Moreover, a FinFET must remove a isolation layer below a recessed gate compared with a conventional recessed gate, thus the volume of a word line increases. When the volume of the word line increases, the coupling capacitance between the word lines increases greatly thereby inducing a signal delay of the word line. Further, when turning on the word line adjacent to the active regions, the electric field in the junction area is concentrated. Thus, the refresh property may deteriorate due to increased leakage current.

Therefore, a method for minimizing the loss in the isolation layer while ensuring the margin of the cell threshold voltage and improving the refresh property and cell current characteristics by realizing the advantages of a FinFET structure and a transistor structure having recessed channels is demanded.

BRIEF SUMMARY OF THE INVENTION

The invention provides a method for manufacturing a semiconductor device having bulb-type recessed channels that forms a semiconductor device having advantages of FinFET structure and bulb-type recessed channels to increase the effective channel length thereby improving refresh properties and cell current characteristics.

In accordance with one aspect, the invention provides a method for manufacturing a semiconductor device having a bulb-type recessed channel including: forming a trench that defines an active region including a channel region and a junction region in a semiconductor substrate; forming a device isolation layer that buries the trench, and forming a sidewall pattern that covers the sidewall of the channel region; forming a bulb-type trench by overlapping with the channel region in the semiconductor substrate, and forming a bottom protrusion having a predetermined space parted from the device isolation layer by removing the sidewall patter and forming a gate stack that overlaps with the bulb-type trench and the bottom protrusion.

The step of forming the sidewall pattern may preferably include: depositing an insulating pattern on the semiconductor substrate after forming the trench; blocking the channel region on the insulating pattern and forming a photoresist pattern that exposes the junction region; etching the insulation pattern using the photoresist pattern as a mask to form a sidewall film that covers the channel region of the active region; forming a filling insulating layer that fills the trench; and planarizing the filling insulating layer to form a isolation layer and forming a sidewall pattern that covers the sidewall of the channel region in the active region.

The step of forming the insulating pattern may preferably include: performing a nitridation process to the semiconductor device at 700° C. to 800° C. in the gas atmosphere containing nitrogen (N) to form a first nitride layer; and depositing a second nitride layer on the first nitride layer with a greater thickness than the first nitride layer.

It is preferable that the first and second nitride layer forming step is carried out in-situ.

The first nitride layer may preferably have a thickness of 5 Å to 15 Å, and the second nitride layer may preferably have a thickness of 150 Å to 250 Å.

It is preferable that the photoresist pattern is an island type so that the channel region is blocked and the junction region is exposed.

It is preferable that the photoresist pattern protrudes from the semiconductor substrate in the channel region with the thickness of the insulating layer.

The step of forming the bulb-type trench may preferably include: forming a mask pattern that exposes the channel region of the active region on the semiconductor substrate; etching the exposed semiconductor substrate using the mask pattern to form a first trench; forming a barrier layer on the sidewall of the first trench; removing the sidewall pattern that covers the sidewall of the channel region to form a bottom protrusion having a predetermined space parted from the isolation layer; and forming a second spherical trench from the bottom surface of the first trench using the barrier layer as a mask to form a bulb-type trench consisting of the first trench and the second trench.

The mask pattern may preferably have a laminated structure of an oxide film and a polysilicon film.

BRIEF DESCRIPTION OF THE DRAWINGS

The above and other aspects, features and other advantages of the invention will be more clearly understood from the following detailed description taken in conjunction with the accompanying drawings, in which.

DETAILED DESCRIPTION OF THE INVENTION

Figure 1A:
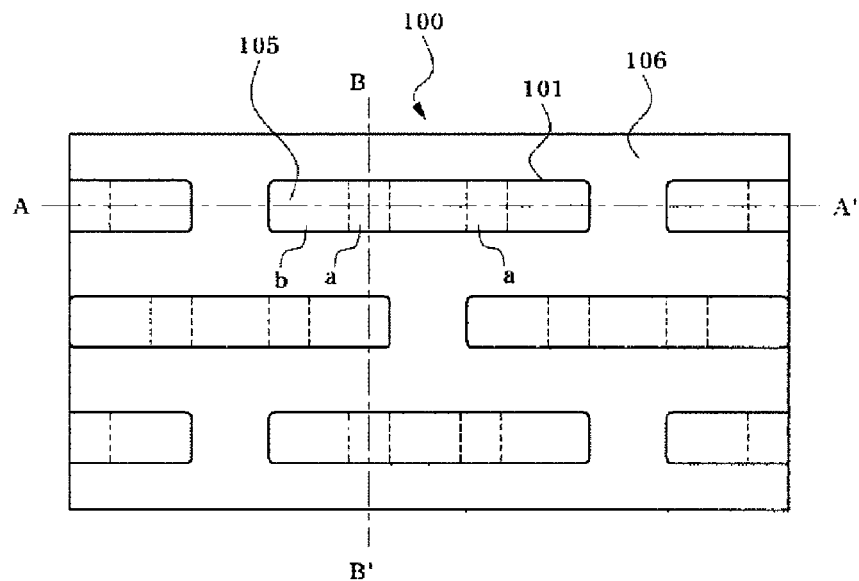
FIGS. 1A to 11B are diagrams illustrating a method for manufacturing a semiconductor device having bulb-type recessed channels according to an embodiment of the invention.

Preferred embodiments of the invention will now be described in detail with reference to the accompanying drawings. However, various variations and modifications can be made in the embodiments and the invention is not to be construed as limited to the following embodiments. The thickness has been magnified to clearly illustrate a plurality of layers and regions in the drawing. The same numerical symbols have been given to the similar parts throughout the specification.

FIGS. 1A to 11B are diagrams illustrating a method for manufacturing a semiconductor device having bulb-type recessed channels according to an embodiment of the invention.

Figure 1B:
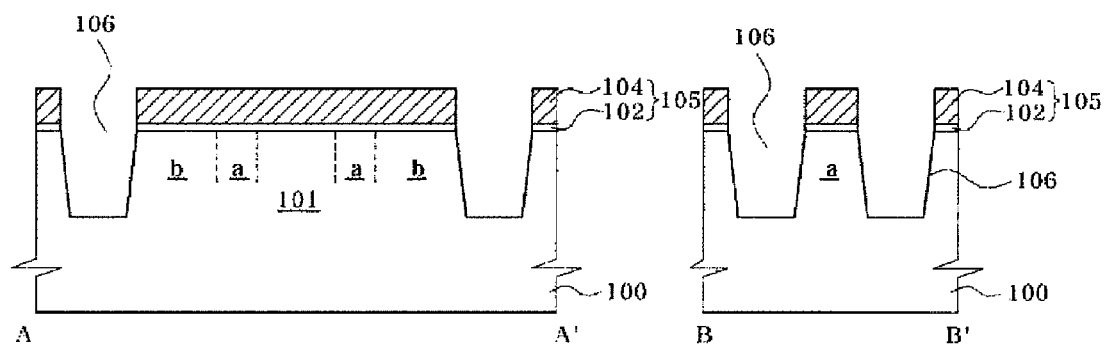

Referring to FIGS. 1A and 1B, a trench 106 for device isolation is formed in a semiconductor substrate 100. Here, FIG. 1B is a part of a cross-sectional view along in the direction of A-A' and B-B' of FIG. 1A. Hereinafter, description thereof will be omitted.

Specifically, a pad oxide layer and pad nitride layer are sequentially deposited on the semiconductor substrate 100. Here, the pad oxide layer has a thickness of 50 Å to 150 Å, and the pad nitride layer has a thickness of 500 Å to 700 Å. Subsequently, the pad oxide layer and pad nitride layer are patterned to form a mask pattern 105 including a pad oxide pattern 102 and a pad nitride pattern 104 that exposes a device isolation region of the semiconductor substrate 100. Next, the exposed portion of the semiconductor substrate 100 is etched using the mask pattern 105 as an etching mask to form the trench 106 for the device isolation that defines active regions 101. The trench 106 for the device isolation may preferably be etched with a depth of 2000 Å to 3000 Å. At this time, the active regions 101 are defined including channel regions a to be formed later and junction regions b to be arranged in both sides of the channel regions a. The channel regions a defined on the active regions 101 are arranged between the junction regions b where gate stacks will be formed by overlapping with the channel regions a.

Figure 2A:
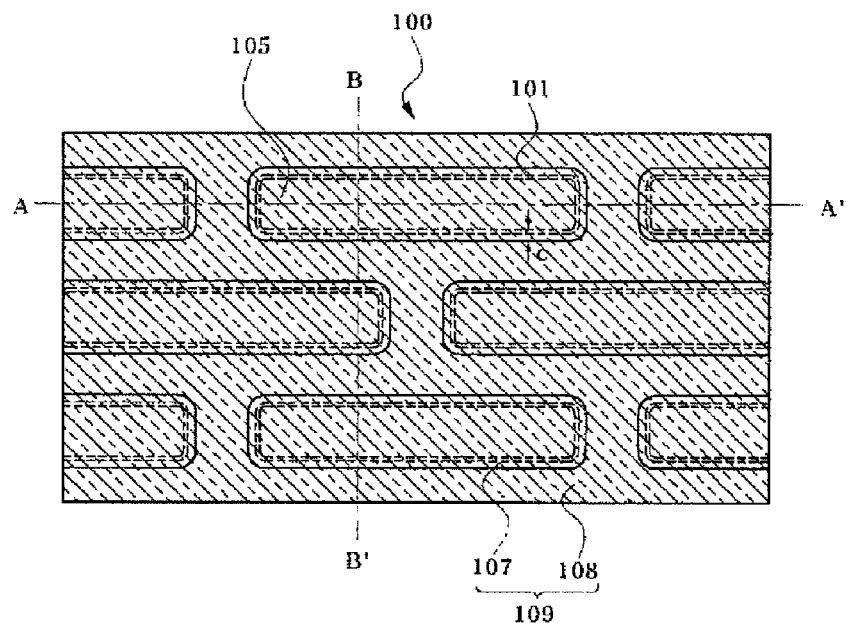
Figure 2B:
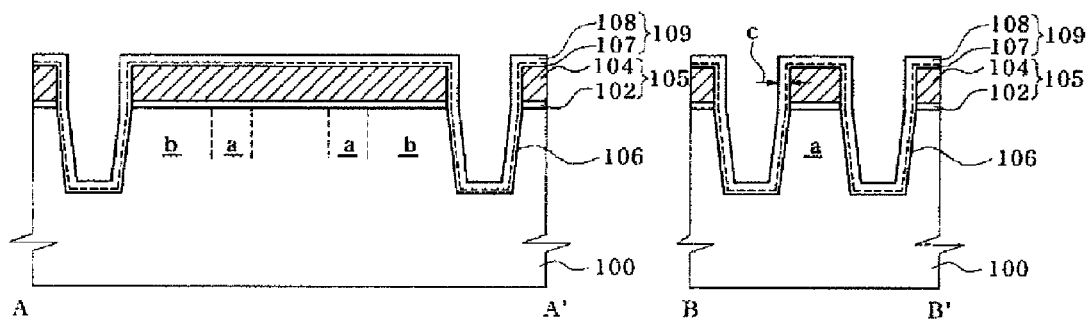

Referring to FIGS. 2A and 2B, an insulating layer 109 is formed on the semiconductor substrate 100.

Specifically, a first thin nitride layer 107 preferably having a thickness of 5 Å to 15 Å is formed on the semiconductor substrate 100 by carrying out a nitridation process at the process temperature of 750° C. in the ammonium ($NH_3$) gas atmosphere. Subsequently, a second nitride layer 108 having a greater thickness than the first nitride layer 107, for example a thickness of 150 Å to 250 Å, is deposited on the first thin nitride layer 107 to form an insulating pattern 109. Here, the deposition of the second nitride layer 108 on the first nitride layer 107 may be carried out in-situ. The insulating pattern 109 is formed to derive Fin strictures including protrusion structures from the bottom later. With the deposition of the second nitride layer 108 having a thickness of 150 Å to 250 Å, the insulation pattern 109 covers the outer surface of the mask pattern 105 with a predetermined thickness C, as shown in FIG. 2A.

Figure 3A:
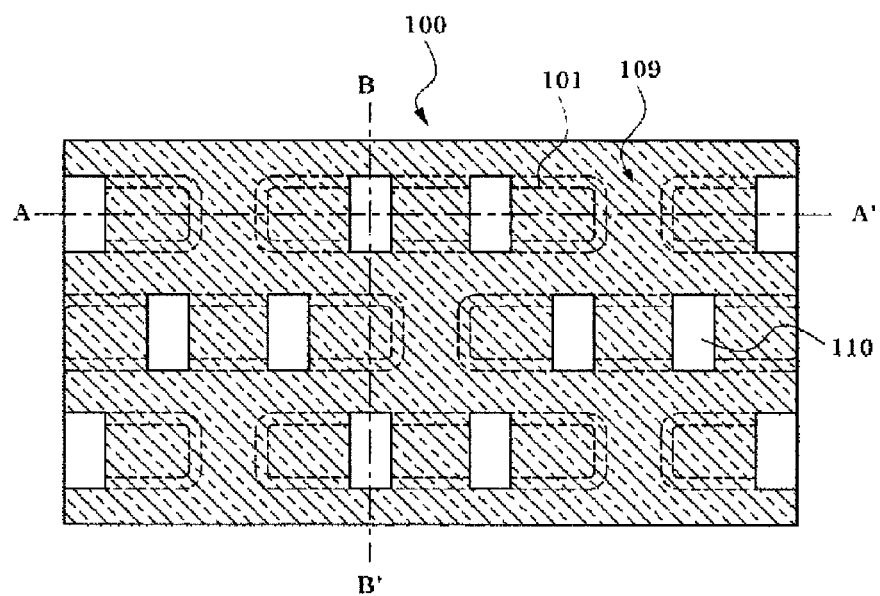
Figure 3B:
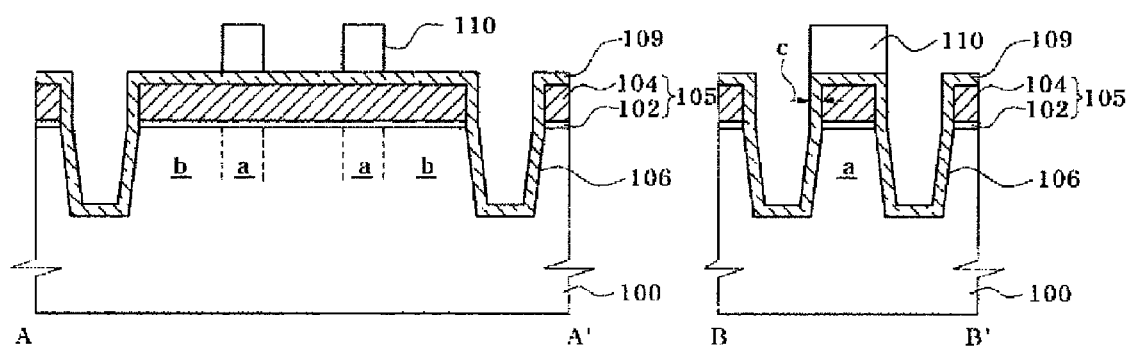

Referring to FIGS. 3A and 3B, a photoresist layer is coated and patterned on the semiconductor substrate 100 to form photoresist patterns 110 that expose the insulating pattern 109 selectively. It is preferable that the photoresist patterns 110, as shown in FIG. 3B, are an island type that exposes selectively so that the insulating pattern 109 on the channel regions is blocked. At this time, as shown in FIG. 3A and FIG. 3B illustrating the part of a cross-sectional view along in the direction of B-B' of FIG. 3A, it is preferable that the photoresist patterns 110 are formed such that they protrude from the semiconductor substrate 100 in a predetermined thickness c of the insulating pattern 109 covering the mask pattern 105. Accordingly, in the channel regions a blocked by the photoresist patterns 110 with a predetermined thickness c a from the semiconductor substrate 100, the bottom protrusions having a Fin shape are formed later.

Figure 4A:
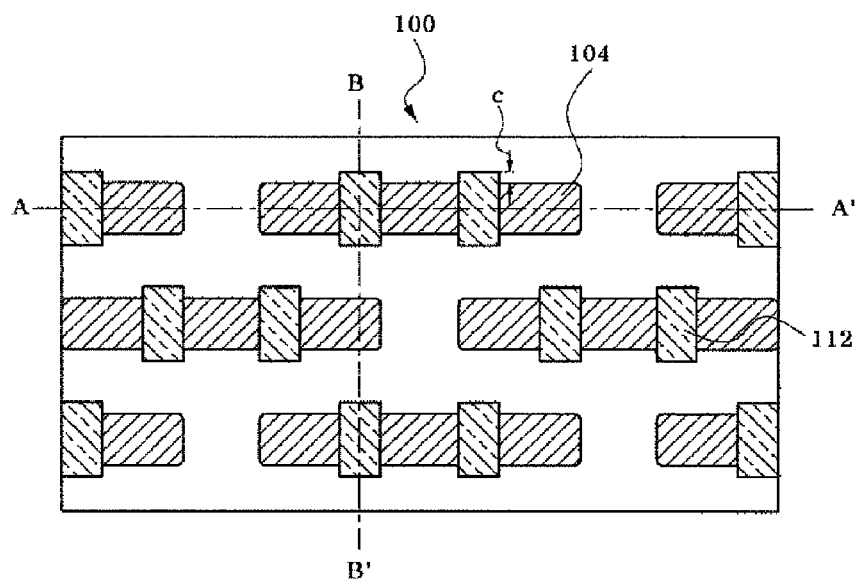
Figure 4B:
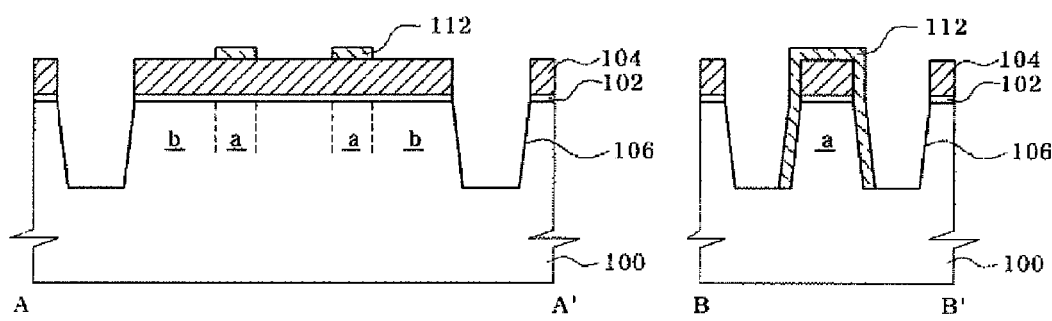

Referring to FIGS. 4A and 4B, the insulating pattern 109 is etched using the photoresist patterns 110 as an etching mask to form sidewall films 112 that cover the channel regions a exposed by the trench 106 of the active regions.

Specifically, the insulating pattern 109 is etched by carrying out the etching process using the photoresist patterns 110 as a mask. Thereby, the trench 106 is exposed, as shown in FIG. 4A and FIG. 4B illustrating the part of a cross-sectional view along in the direction of B-B', and the insulating pattern 109 in the channel regions a that corresponds with the thickness c, where the photoresist patterns 110 protrudes, remains so as to form sidewall films 112 covering the channel regions a. At this time, the sidewall films 112 are formed such that the Junction regions b are not covered.

Figure 5A:
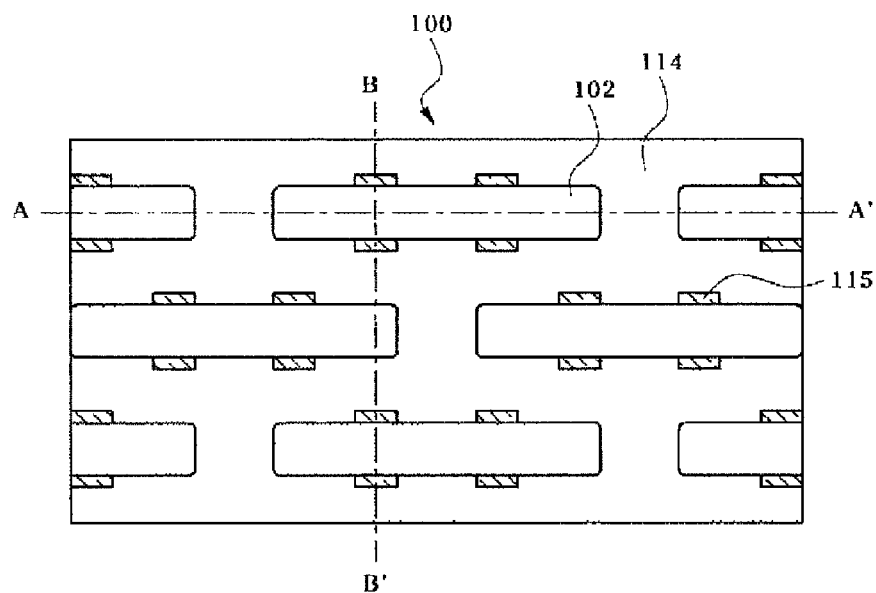
Figure 5B:
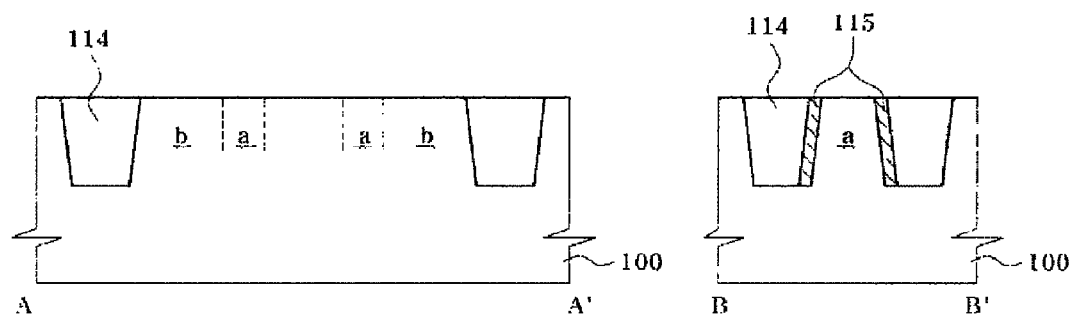

Referring to FIGS. 5A and 5B, a isolation layer 114 that fills the trench 106 is formed, and then the mask pattern 105 is removed to form sidewall patterns 115.

Specifically, a typical sidewall oxide layer (not shown) and a liner nitride layer (not shown) are deposited on the exposed surface of the trench 106, and a filling insulating layer that fills the trench 106 is formed. Next, a planarization process on the filling insulating layer, for example a chemical mechanical polishing (CMP) method, is performed to form the isolation layer 114. Subsequently, the mask pattern 110 including the pad nitride pattern 104 and pad oxide pattern 102, is removed. When the pad nitride pattern 104 and pad oxide pattern 102 are removed, the sidewall films 112 on the top and partial side surfaces of the mask pattern 105 are removed, and sidewall patterns 115 covering the sidewalls of the channel regions a are formed, as shown in FIG. 5A and FIG. 5B illustrating the part of a cross-sectional view along in the direction of B-B' of FIG. 5A.

Figure 6A:
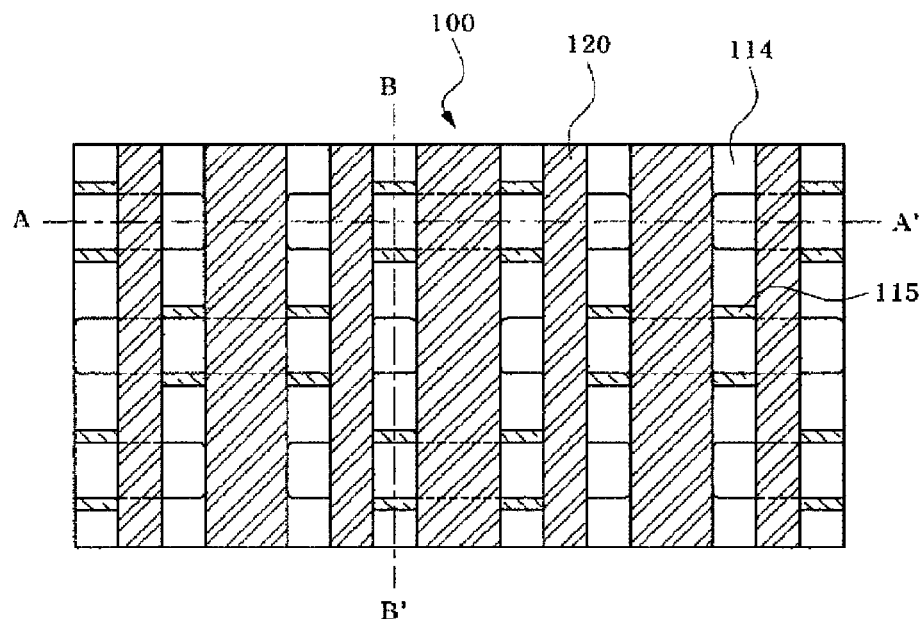
Figure 6B:
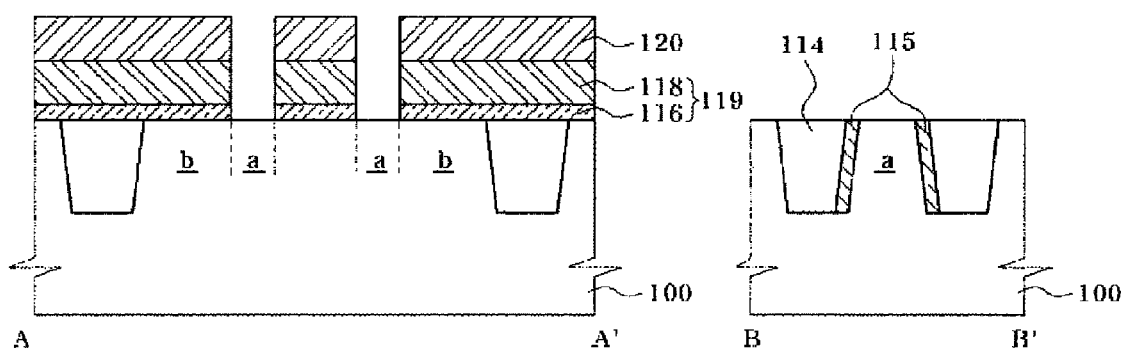

Referring to FIGS. 6A and 6B, hard mask patterns 119 and photoresist patterns 120 that expose the channel regions a of the semiconductor substrate 100 are formed.

Specifically, an oxide layer and a polysilicon layer are deposited on the semiconductor substrate 100 sequentially. Here, the oxide layer and the polysilicon layer play a role as hard mask layers in the process of etching to form the bulb-type trenches later. At this time, the oxide layer may preferably be deposited with a thickness of 300 Å to 500 Å, and the polysilicon layer may preferably be deposited with a thickness of 800 Å to 1200 Å. Next, a photoresist layer is coated and patterned on the polysilicon layer to form photoresist layer patterns 120 that expose a predetermined region of the polysilicon layer. Subsequently, the polysilicon layer and the oxide layer are etched using the photoresist pattern 120 as a mask to form hard mask patterns 119 including polysilicon patterns 118 and oxide patterns 116 that expose the channel regions a of the semiconductor substrate 100. Here, the exposed channel regions a of the semiconductor substrate 100 will form the bulb-type trenches later. Meanwhile, as shown in FIG. 6B illustrating the part of a cross-sectional view along in the direction B-B' of FIG. 6A, the portions where the sidewall patterns 115 are formed covering the sidewalls of the channel regions a are not being blocked by the hard mask pattern 119, but are exposed.

Figure 7A:
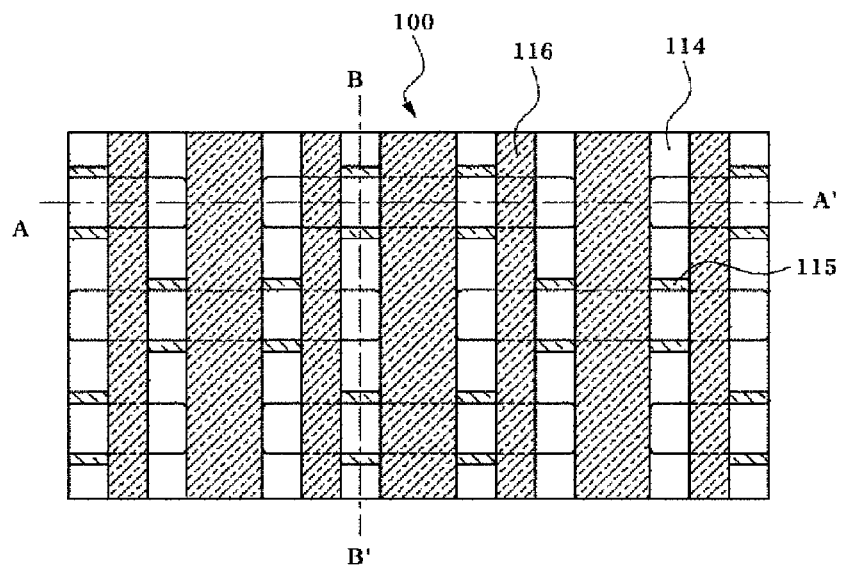
Figure 7B:
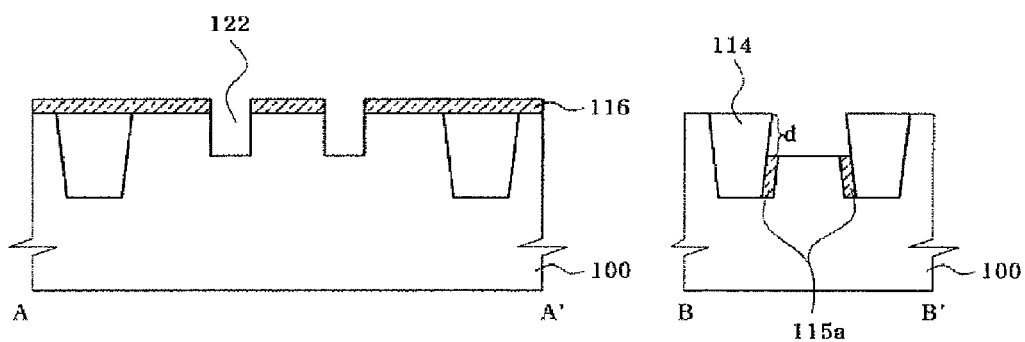

Referring to FIGS. 7A and 7B, a primary etching process for etching the exposed channel regions a of the semiconductor substrate 100 using the hard mask pattern 119 as an etching mask is carried out to form first trenches 122 in the semiconductor substrate 100. Here, the first trenches 122 correspond to the neck portion of the bulb-type trenches. It is preferable that the first trenches 122 have an appropriate depth, for example 700 Å to 1500 Å considering the size of the bulbs to be formed later. Next, the photoresist patterns 120 are removed using a strip process. At this time, the polysilicon patterns 118 are also removed in the process of removing the photoresist patterns 120. Then, a washing process is carried out to remove impurities on the semiconductor substrate 100 generated during the etching process.

Meanwhile, referring to FIG. 7B illustrating the part of a cross-sectional view along in the direction B-B' of FIG. 7A, the portions exposed in the process of carrying out etching to form the first trenches 122, for example sidewall patterns 115a covering the sidewalls of the channel regions a are also etched to a predetermined depth d from the surface of the semiconductor substrate 100.

Figure 8A:
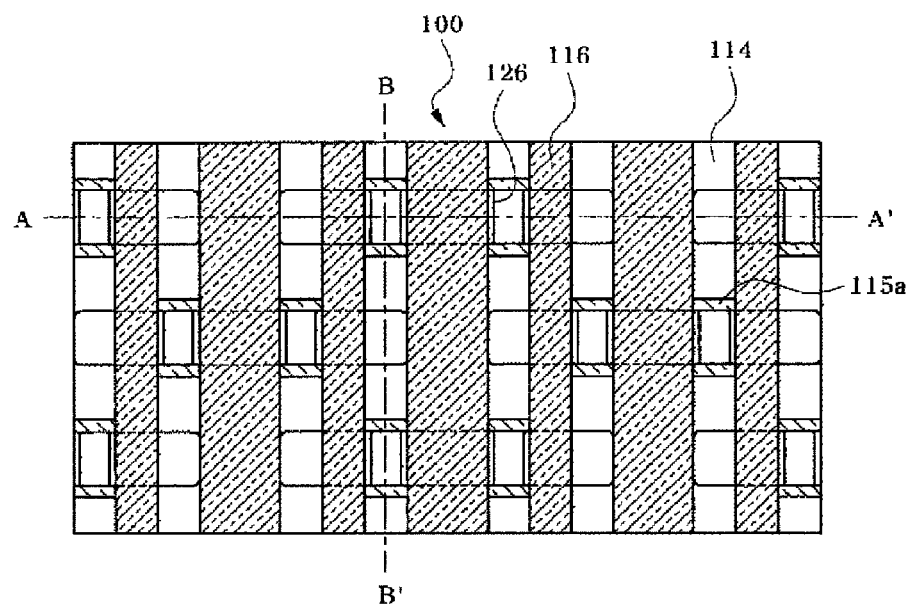
Figure 8B:
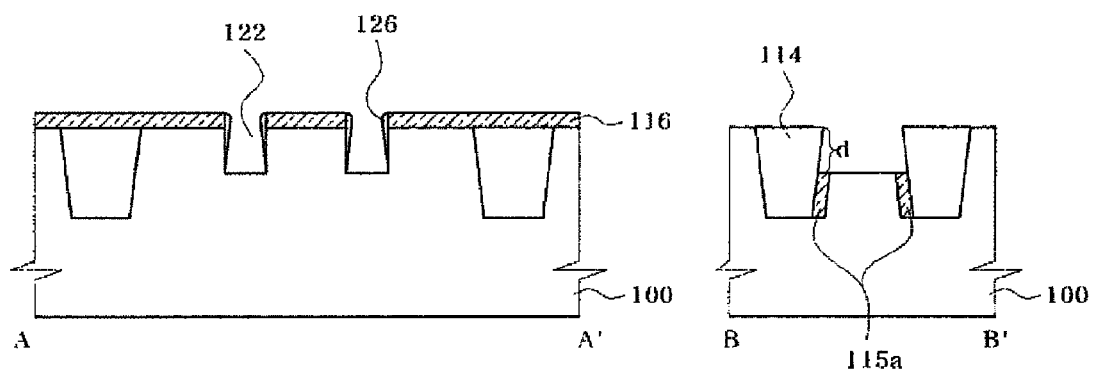

Referring to FIGS. 8A and 8B, barrier layers 126 are formed on the sidewalls of the first trenches 122.

Specifically, an oxide layer is formed on the whole surface of the semiconductor substrate 100. The oxide layer is preferably deposited with a thickness of 30 Å to 70 Å by high thermal oxidation (HTO). Next, the oxide layer on the top, bottom, and partial side surfaces of the first trenches 122 are etched selectively to form the barrier layers 126. Thereby, the silicon (Si) layer on the bottom and partial side surface of the first trenches 122 is exposed. The barrier layers 126 play a role in preventing the side surface of the trenches from being overly etched in the etching process for forming the bulb-type trenches later.

Figure 9A:
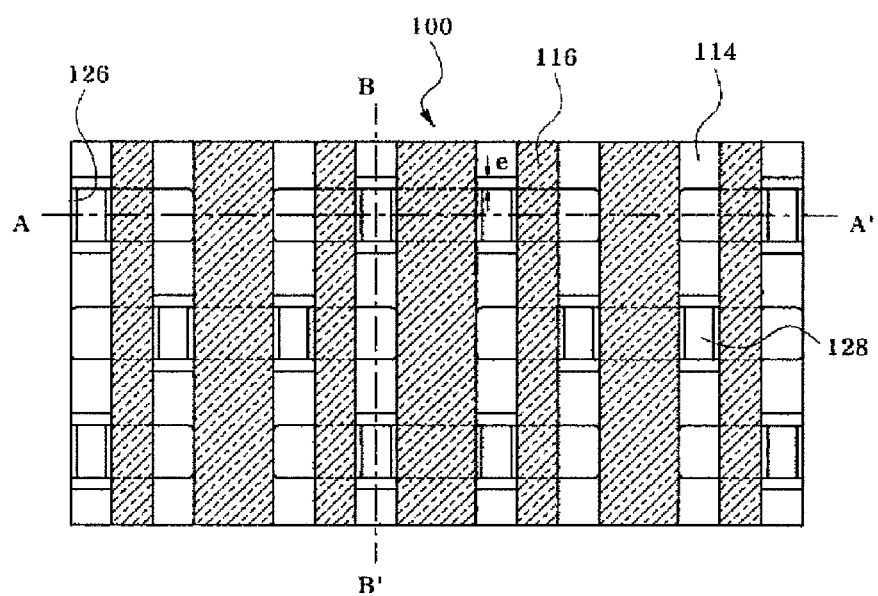
Figure 9B:
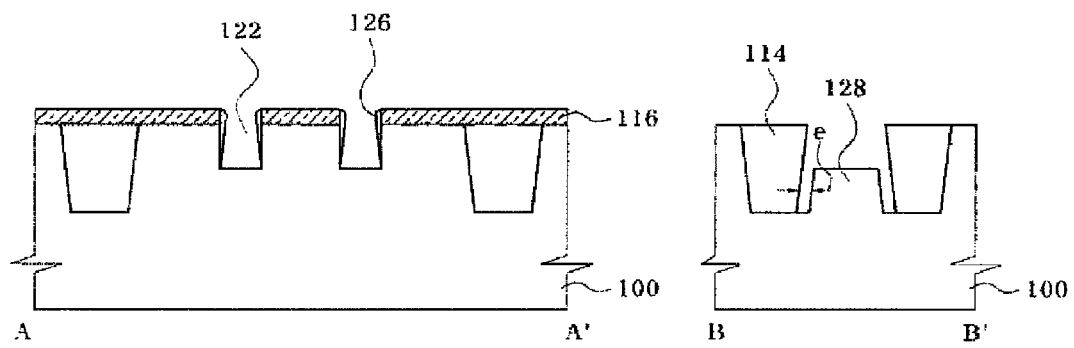

Referring to FIGS. 9A and 9B, the strip process that removes the nitride layer is carried out to remove the sidewall patterns 115a covering the sidewalls of the channel regions a. Referring to FIG. 9B illustrating the part of a cross-sectional view along in the direction B-B' of FIG. 9A, the sidewall patterns 115a are removed by the strip process, and bottom protrusions 128 are formed. Thus formed bottom protrusions 128 have spaces disposed at predetermined distances from the device isolation layers 114. That is, the bottom protrusions 128 are formed in a Fin shape thereby realizing the same profile as a FinFET.

Figure 10A:
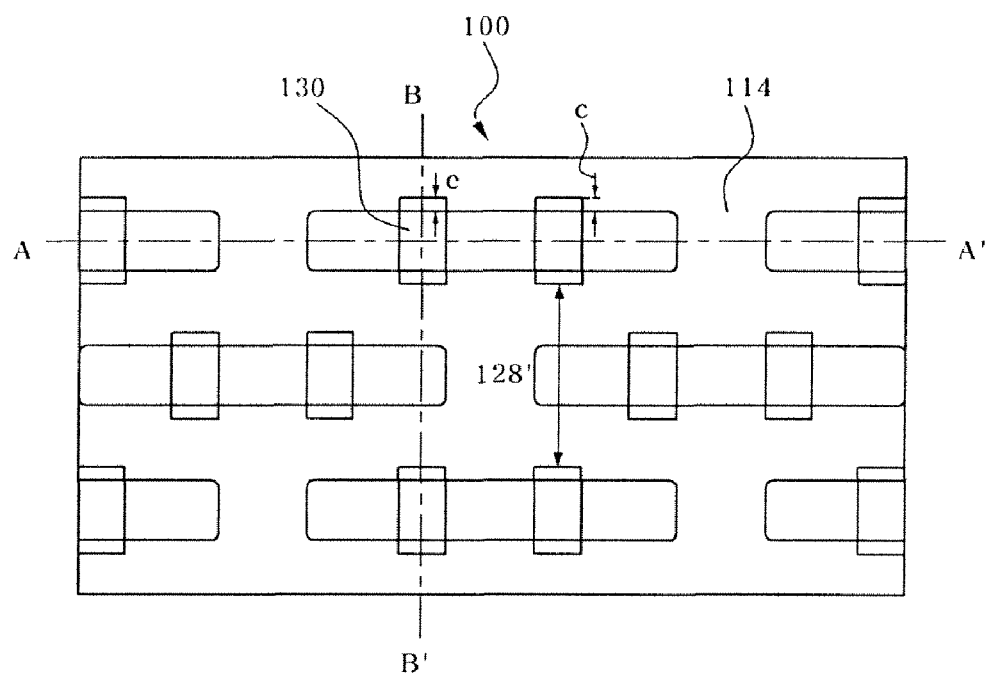
Figure 10B:
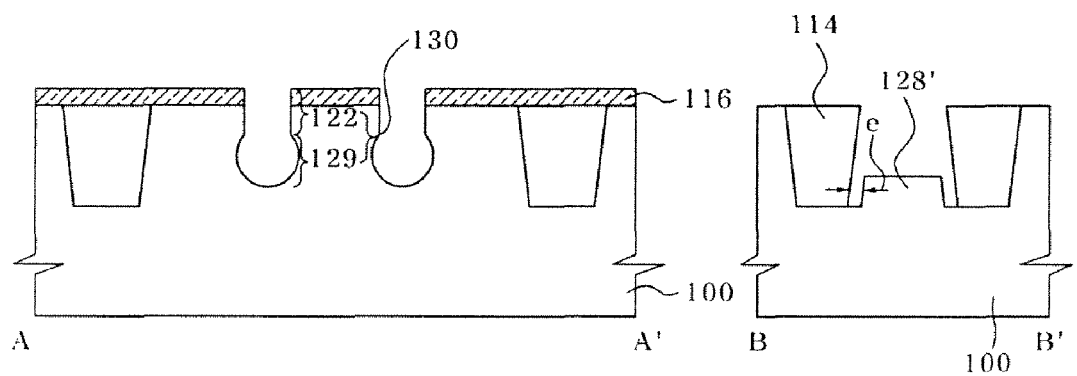

Referring to FIGS. 10A and 10B, an etching process is carried out using the oxide patterns 116 and barrier layers 126 as a mask to form second spherical trenches 129 in the lower portion of the first trenches 122. Thereby, bulb-type trenches 130 consisting of the first trenches 122 and the second spherical trenches 129 are formed. Here, it is preferable that the second spherical trenches are etched from the bottom surface of the first trenches 122. Such etching process that forms the second spherical trenches 129 may be carried out by isotropic etching in which the etching is performed from all directions with the same speed such that the shape after the etching has spherical surface.

At this time, the barrier layers 216 play a role in preventing damage on the semiconductor substrate 100 that can be generated by the bulb-type trenches 130 being overly etched. Next, the oxide layers 116 and the barrier layers 216 are removed, and by carrying out a light etching treatment (LET) process, impurities on the semiconductor substrate 100 are removed. Meanwhile, in the process of carrying out the etching process to form the second spherical trenches 129, the bottom protrusions 128' being exposed to the etching source are also etched to a certain depth, thereby the protrusion height is lowered, as shown in FIG. 10B illustrating the part of a cross-sectional view along in the direction B-B' of FIG.

Figure 11A:
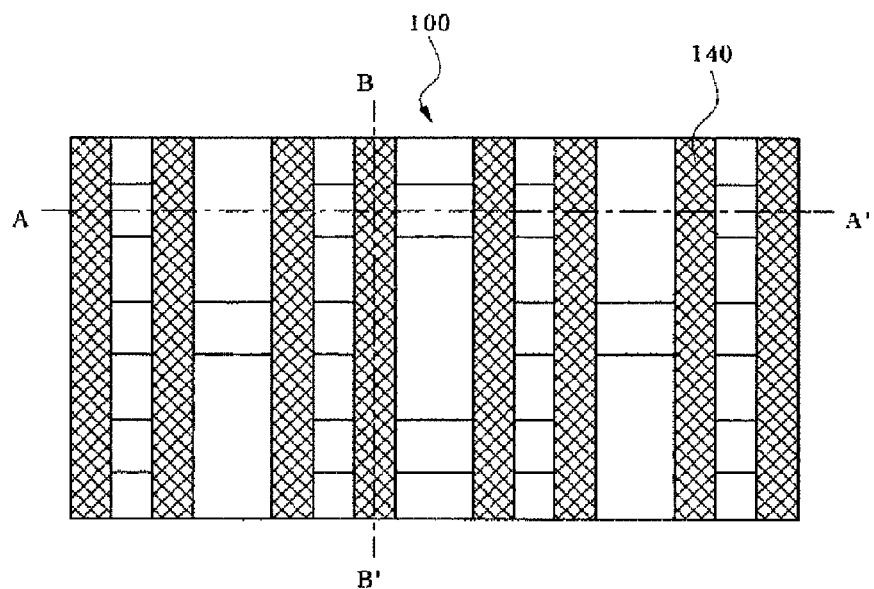
Figure 11B:
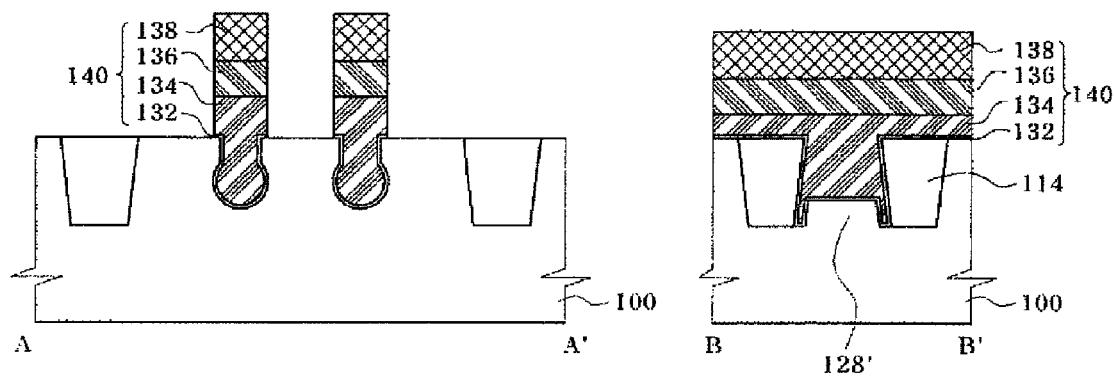

Referring to FIGS. 11A and 11B, gate stacks 140 that overlap with the bulb-type trenches 130 are formed.

Specifically, an oxide layer is preferably formed on the semiconductor substrate 100 with a thickness of 30 Å to 50 Å as a gate insulating layer, and a polysilicon film doped with a gate conducting layer is preferably formed with a thickness of 400 Å to 700 Å. Next, a tungsten silicide (WSi$\chi$) film is preferably formed on the gate conducting layer with a thickness of 100 Å to 1500 Å as a gate metal layer, and a hard mask layer is preferably formed with a thickness of 2000 Å to 2500 Å. Then, a selective etching process is performed for gate patterning to form gate stacks 140. The gate stacks 140, as shown in FIG. 11A, are formed in a line type, and include gate insulating patterns 132, gate conducting patterns 134, gate metal patterns 136 and hard mask pattern 138. Although not shown in FIG. 11A, source/drain regions are formed by injecting a source/drain dopant.

Thus formed gate stacks 140 having bulb-type recessed channels include the bottom protrusions 128' having the same profile as a FinFET. Thereby, the parasitic capacitance of the word line may be reduced, and the junction leakage current by the passing gate effect may be minimized. By forming bulb-type recessed channels, more improved refresh property can be ensured compared with a conventional FinFET that is realized in U-shaped recessed gate. Moreover, normal cell device characteristics can be ensured in spite of a decrease in the design rules. Furthermore, improvement in the refresh property and cell current characteristics can be obtained since the effective channel length is increased by the bulb-type recessed channels.

Therefore, according to the method for manufacturing a semiconductor device having bulb-type recessed channels of the invention, the parasitic capacitance can be reduced and the junction leakage current can be minimized by the bulb-type recessed channels and bottom protrusions.

Further, the current characteristics and refresh property of the device can be improved by increasing the effective channel length.

The embodiments of the invention have been disclosed above for illustrative purposes. Those skilled in the art will appreciate that various modifications, additions and substitutions are possible, without departing from the scope and spirit of the invention as defined in the accompanying claims.

What is claimed is:

1. A method for manufacturing a semiconductor device having a bulb-type recessed channel comprising:

forming a trench that defines an active region including a channel region that defines a sidewall and a junction region in a semiconductor substrate;

forming an isolation layer that fills the trench, and forming a sidewall pattern that covers a sidewall of the channel region;

forming a first trench defining a sidewall in the channel region by etching the semiconductor substrate, forming a barrier layer on the sidewall of the first trench;

removing the sidewall pattern to form a bottom protrusion having exposed side surfaces spaced a predetermined distance from the isolation layer, forming a second, spherical trench from the bottom surface of the first trench using the barrier layer as an etch mask to form a bulb-type trench consisting of the first trench and the second trench; and forming a gate stack that fills the bulb-type trench and the bottom protrusion including the exposed side surfaces.

2. The method according to claim 1, wherein the step of forming the sidewall pattern comprises:

depositing an insulating pattern on the semiconductor substrate after forming the trench;

blocking the channel region on the insulating pattern and forming a photoresist pattern that exposes the junction region;

etching the insulation pattern using the photoresist pattern as a mask to form a sidewall film that covers the channel region of the active region;

forming a filling insulating layer that fills the trench; and planarizing the filling insulating layer to form a isolation layer and forming a sidewall pattern that covers the sidewall of the channel region in the active region.

3. The method according to claim 2, wherein the step of forming the insulating pattern comprises:

performing a nitridation process to the semiconductor device at 700° C. to 800° C. in a gas atmosphere containing nitrogen (N) to form a first nitride layer; and depositing a second nitride layer on the first nitride layer with a greater thickness than the first nitride layer.

4. The method according to claim 3, comprising forming the first and second nitride layers in-situ.

5. The method according to claim 3, wherein the first nitride layer has a thickness of 5 Å to 15 Å.

6. The method according to claim 3, wherein the second nitride layer has a thickness of 150 Å to 250 Å.

7. The method according to claim 2, wherein the photoresist pattern is an island type so that the channel region is blocked and the junction region is exposed.

8. The method according to claim 2, wherein the photoresist pattern is formed on the insulating pattern and protrudes in an isolation region direction with the thickness of the insulating layer.

* * * * *